(12) United States Patent
Tokura

(10) Patent No.: US 11,313,031 B2
(45) Date of Patent: Apr. 26, 2022

(54) METHOD FOR FORMING ALUMINUM FILM

(71) Applicant: Mitsubishi Electric Corporation, Tokyo (JP)

(72) Inventor: Yuji Tokura, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 141 days.

(21) Appl. No.: 16/376,937

(22) Filed: Apr. 5, 2019

(65) Prior Publication Data
US 2019/0390319 A1 Dec. 26, 2019

(30) Foreign Application Priority Data
Jun. 21, 2018 (JP) .............................. JP2018-117580

(51) Int. Cl.
*C23C 14/16* (2006.01)
*C23C 14/34* (2006.01)
*H01L 21/02* (2006.01)

(52) U.S. Cl.
CPC ........ *C23C 14/165* (2013.01); *C23C 14/3421* (2013.01); *H01L 21/02631* (2013.01)

(58) Field of Classification Search
CPC .............. C23C 14/165; C23C 14/3421; C23C 14/5806; H01L 21/02631; H01L 2224/05624; H01L 21/2855; H01L 23/53219; H01L 21/76882; H01L 2924/01013; H01L 2924/01014; H01L 2224/81815; H01L 2224/05568; H01L 2224/05018; H01L 2224/0383; H01L 23/3192; H01L 2224/13083
See application file for complete search history.

(56) References Cited

U.S. PATENT DOCUMENTS 5,723,367 A    3/1998 Wada et al.
5,970,377 A *  10/1999 Park ................... H01L 21/76877
                                                    438/643

(Continued)

FOREIGN PATENT DOCUMENTS

JP   H07-249633 A   9/1995
JP   H08-097279 A   4/1996

(Continued)

OTHER PUBLICATIONS

JP-2010165989-A Translation (Year: 2010).*

(Continued)

*Primary Examiner* — Jennifer Wecker
*Assistant Examiner* — Patrick S Ott
(74) *Attorney, Agent, or Firm* — Studebaker & Brackett PC

(57) ABSTRACT

Provided is a technique of forming an aluminum film that has high flatness and less cavities. Step S11 is forming a first film having a thickness that is equal to or greater than 0.1 μm and less than 1 μm, by sputtering a material onto a substrate. Step S12 is reflowing the first film by heating the first film. Step S13 is forming a second film by sputtering the material onto the first film that has been reflowed. Step S14 is reflowing the second film by heating the second film. Step S15 is forming a third film by sputtering the material onto the second film that has been reflowed. Step S16 is reflowing the third film by heating the third film.

4 Claims, 7 Drawing Sheets

(56) References Cited

U.S. PATENT DOCUMENTS

| | | | | |
|---|---|---|---|---|
| 6,123,992 | A * | 9/2000 | Sugai | C23C 16/045 427/250 |
| 6,221,754 | B1 * | 4/2001 | Chiou | H01L 21/76877 257/E21.585 |
| 6,307,267 | B1 * | 10/2001 | Wada | H01L 21/76843 257/761 |
| 6,355,558 | B1 * | 3/2002 | Dixit | H01L 21/76856 438/642 |
| 2003/0139033 | A1 * | 7/2003 | Gardner | H01L 21/76882 438/632 |
| 2004/0048460 | A1 * | 3/2004 | Asahina | H01L 21/76828 438/622 |
| 2004/0102001 | A1 * | 5/2004 | Goebel | H01L 27/10888 438/239 |
| 2008/0169570 | A1 * | 7/2008 | Saito | H01L 21/76858 257/774 |
| 2016/0181379 | A1 * | 6/2016 | Akao | H01L 29/41741 257/331 |

FOREIGN PATENT DOCUMENTS

| | | | | | |
|---|---|---|---|---|---|
| JP | H1041388 | A | * | 2/1998 | |
| JP | H11-067908 | A | | 3/1999 | |
| JP | H11-145143 | A | | 5/1999 | |
| JP | 2003318395 | A | * | 11/2003 | H01L 21/76846 |
| JP | 2005-347313 | A | | 12/2005 | |
| JP | 2010165989 | A | * | 7/2010 | H01L 21/76814 |

OTHER PUBLICATIONS

JP-2003318395-A Translation (Year: 2003).*

JP2003318395A Hand Translation (Year: 2003).*

JPH1041388A Translation (Year: 1998).*

An Office Action issued by the German Patent Office dated Jan. 21, 2021, which corresponds to German Patent Application No. 10 2019 207 802.8 and is related to U.S. Appl. No. 16/376,937 with English language translation.

An Office Action; "Notice of Reasons for Refusal", mailed by the Japanese Patent Office dated Apr. 13, 2021, which corresponds to Japanese Patent Application No. 2018-117580 and is related to U.S. Appl. No. 16/376,937; with English language translation.

An Office Action issued by the German Patent and Trade Mark Office dated May 3, 2021, which corresponds to German Patent Application No. 10 2019 207 802.8 and is related to U.S. Appl. No. 16/376,937 with English language translation.

An Office Action issued by the German Patent and Trade Mark Office dated Aug. 5, 2021, which corresponds to German Patent Application No. 10 2019 207 802.8 and is related to U.S. Appl. No. 16/376,937; with English language translation.

An Office Action; "Notice of Reasons for Refusal," mailed by the Japanese Patent Office dated Aug. 10, 2021, which corresponds to Japanese Patent Application No. 2018-117580 and is related to U.S. Appl. No. 16/376,937 with with English translation.

* cited by examiner

F I G. 6
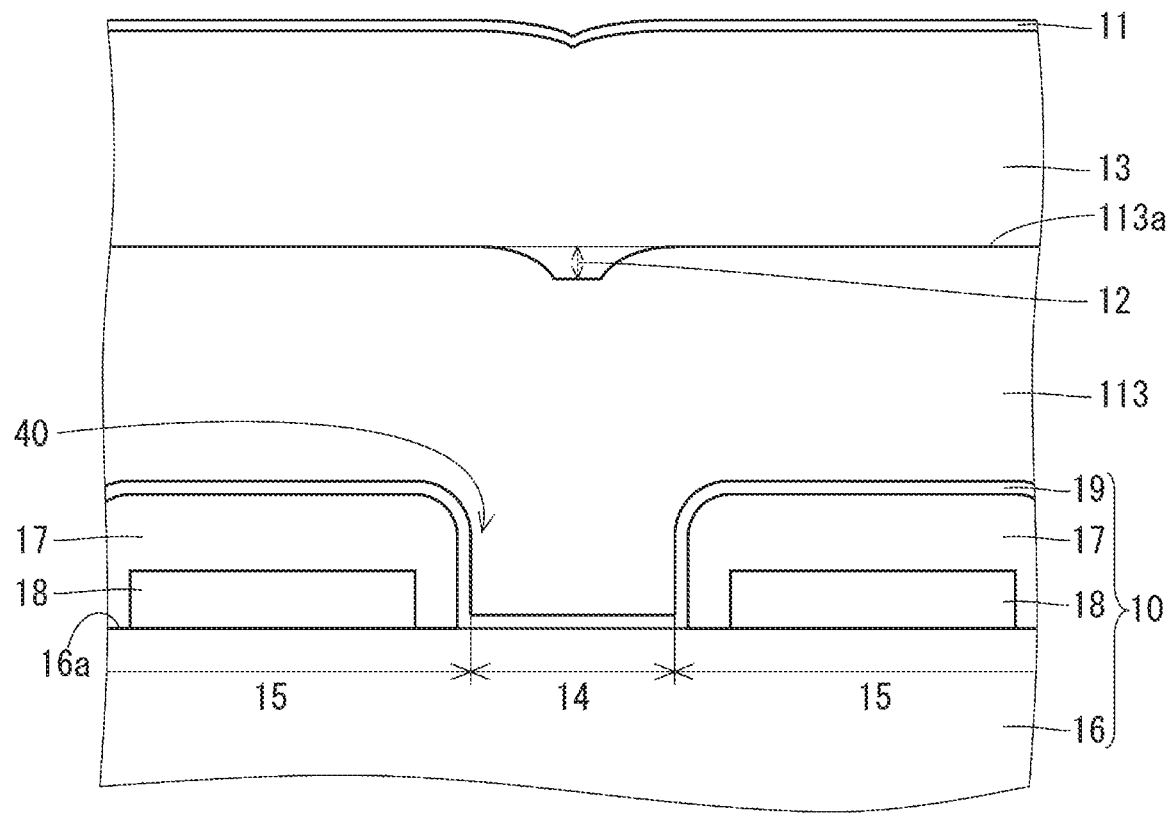

F I G. 7
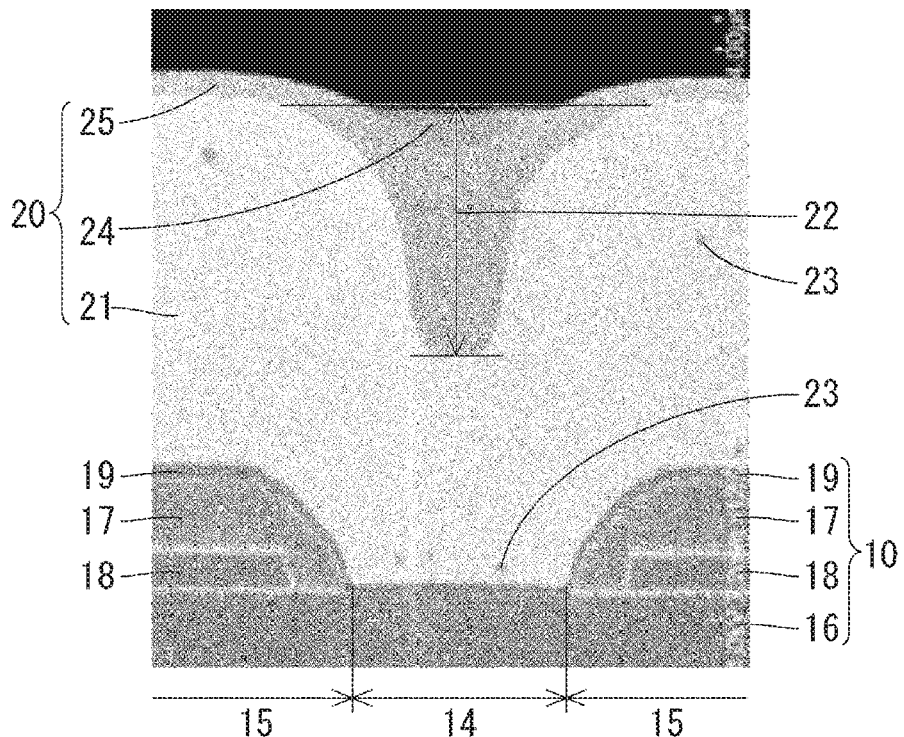
F I G. 8
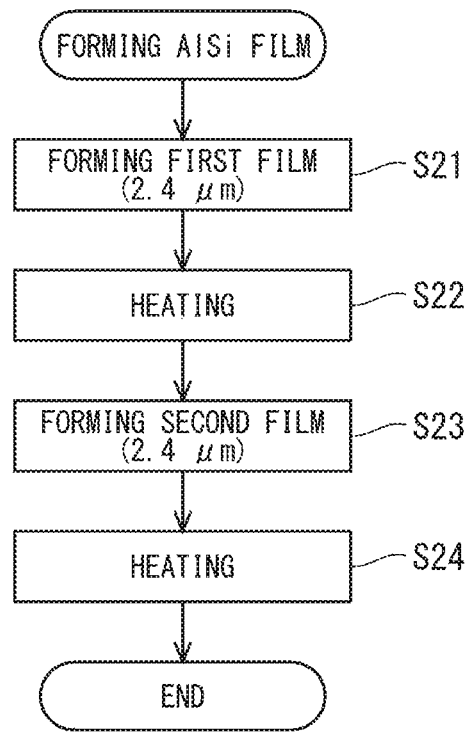

METHOD FOR FORMING ALUMINUM FILM

BACKGROUND OF THE INVENTION

Field of the Invention

The present invention relates to a method for forming an aluminum film.

Description of the Background Art

In the manufacture of semiconductor devices, forming aluminum (Al) or an aluminum compound (e.g., AlSi, AlCu, or AlSiCu) through sputtering is a publicly known technique. Hereinafter, a film of aluminum or of an aluminum compound is also referred to as an aluminum film.

Hot sputtering and reflow sputtering are publicly known as sputtering methods. Hot sputtering includes heating an object (e.g., a substrate on which transistor cells are formed) to undergo film formation while forming a film through sputtering (hereinafter, also referred to as film formation). Reflow sputtering includes heating an object after film formation through sputtering, thus reflowing the formed film.

Reflow sputtering is used in the techniques described in Japanese Patent Application Laid-Open No. 2005-347313 and Japanese Patent Application Laid-Open No. 8-97279. Hot sputtering is used in the technique described in Japanese Patent Application Laid-Open No. 2005-347313. Japanese Patent Application Laid-Open No. 11-145143 describes a technique of forming an aluminum film through chemical vapor deposition (CVD).

A vertical power transistor, for instance, includes a transistor cell whose upper surface is provided with an aluminum film, which is one of electrodes. In some cases, solder joining is used to connect the aluminum film to the outside. In these cases, a Ni layer is formed on the aluminum film. For Ni-layer formation, the aluminum film desirably has high surface-flatness and no cavities in its inside.

Hot sputtering or reflow sputtering can be used to enhance the surface flatness of the aluminum film or prevent cavities.

Normal sputtering refers to sputtering performed with an apparatus in which the distance between a target to be sputtered (e.g., aluminum) and the object (hereinafter, referred to as a "substrate-to-target distance") is about 30 to 80 mm. Long-throw sputtering (LTS) refers to sputtering performed with an apparatus in which the substrate-to-target distance is about 170 to 300 mm.

Normal sputtering has low directionality. Thus, a film, when formed on a recess with a large step through normal sputtering, is not easily deposited on the bottom of the recess, and is easily deposited near the opening of the recess. Since film deposition has such a feature, film formation through normal sputtering tends to cause film combining (or overhanging) around the recess, near the opening. This combining tends to generate cavities inside the film deposited in the recess, and tends to generate a dent on the surface of the film. As such, normal sputtering is disadvantageous in forming of an aluminum film on a semiconductor substrate having a rough surface.

Heating at a temperature near the melting point of aluminum (i.e., 660° C.) does possibly reduce the cavities. However, heating at such a temperature leads to coagulation, and degradation in the device performance of a semiconductor device.

Long-throw sputtering has an excessively low rate of film formation. Hence, long-throw sputtering is disadvantageous in forming of a thick aluminum film of the order of microns.

Aluminum-film formation through CVD, which increases running costs, tact time (or takt time) and process steps, is undesirable. Accordingly, both of these methods lead to cost increase and increase in the number of process steps due to reduction in film formation efficiency.

SUMMARY

It is an object of the present invention to provide a technique of forming, through sputtering, an aluminum film that has high flatness and less cavities.

A method for forming an aluminum film according to the present invention forms, on a substrate, an aluminum film made of a material that is aluminum or an aluminum compound through sputtering. The method includes the following steps: forming a first film having a thickness that is equal to or greater than 0.1 μm and less than 1 μm, by sputtering the material onto the substrate; reflowing the first film by heating the first film; forming a second film by sputtering the material onto the first film that has been reflowed; reflowing the second film by heating the second film; forming a third film by sputtering the material onto the second film that has been reflowed; and reflowing the third film by heating the third film.

An aluminum film is formed that has high flatness and less cavities.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a cross-sectional view of a structure after film formation being performed to the structure illustrated in FIG. 4;

FIG. 7 is a cross-sectional image of a structure obtained through a method for forming an aluminum film according to a first comparative example, the cross-sectional image being viewed with a microscope;

FIG. 8 is a flowchart illustrating a method for forming an aluminum film according to a second comparative example;

DESCRIPTION OF THE PREFERRED EMBODIMENT

Figure 1:
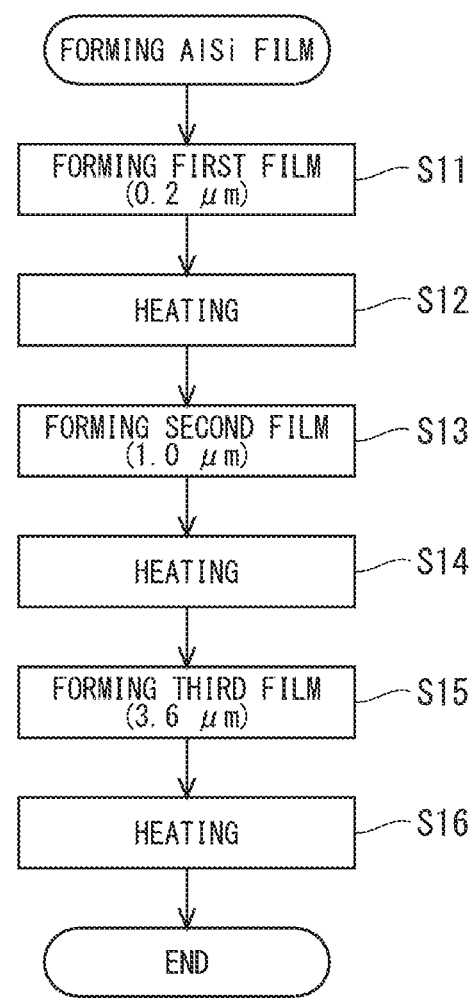
FIG. 1 is a flowchart illustrating a method for forming an aluminum film according to a preferred embodiment.

FIG. 1 is a flowchart illustrating a method for forming an aluminum film according to a preferred embodiment of the present invention. The material of the aluminum film is aluminum or an aluminum compound. An aluminum film of AlSi is formed in the preferred embodiment. The aforementioned material is used as a target to be sputtered, and AlSi is used for instance. The preferred embodiment employs normal sputtering, which is a type of sputtering, and employs a substrate-to-target distance of, for instance, 45 mm. The preferred embodiment describes forming an aluminum film having high flatness, without employing a long-throw sputtering method.

Step S11 is forming a first film. More specifically, the first film is formed by sputtering the target onto a substrate, which will be described later on. Step S12 is reflowing the first film by heating the first film. As such, steps S11 and S12, together, can be referred to as the first reflow sputtering.

Step S13 is forming a second film. More specifically, the second film is formed by sputtering the target onto the first film that has been reflowed. Step S14 is reflowing at least the second film by heating the second film. As such, steps S13 and S14, together, can be referred to as the second reflow sputtering. The reflowing of the first film may be performed through the heating in step S14.

Step S15 is forming a third film. More specifically, the third film is formed by sputtering the target onto the second film that has been reflowed. Step S16 is reflowing at least the third film by heating the third film. As such, steps S15 and S16, together, can be referred to as the third reflow sputtering. The reflowing of the second film, and further, the reflowing of the first film each may be performed through the heating in step S16.

All the first to third films are made of AlSi. The preferred embodiment illustrates that the first film has a thickness of 0.2 µm, the second film has a thickness of 1.0 µm, and the third film has a thickness of 3.6 µm. The heating in steps S12, S14, S16 can be performed at a temperature lower than the melting point of aluminum, that is, at a temperature of 400 to 550° C. (e.g., at 480° C.).

Figure 2:
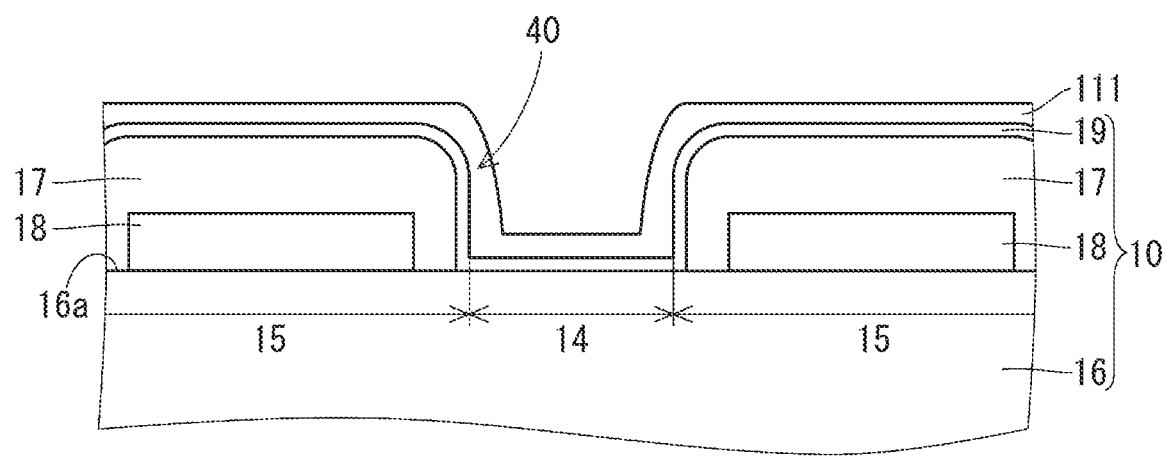
FIGS. 2 to 4 are each a cross-sectional view of a structure obtained through the method according to the preferred embodiment.
Figure 3:
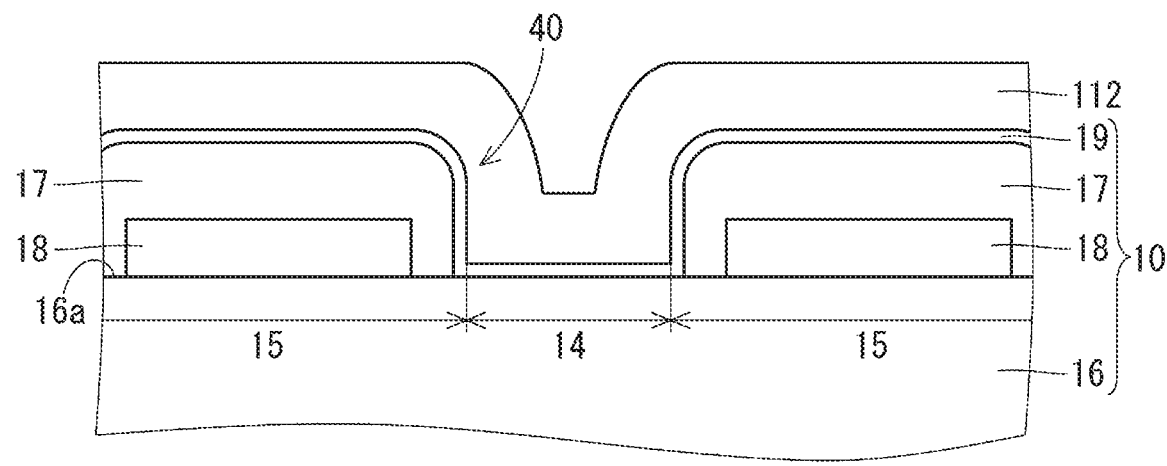
Figure 4:
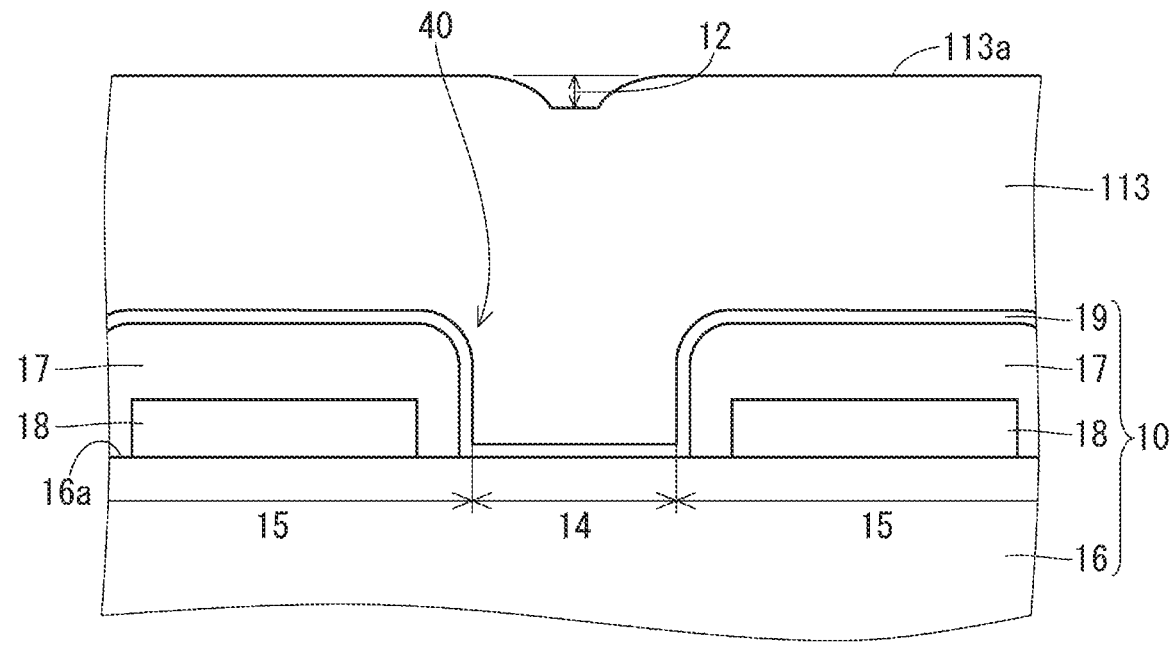

FIGS. 2 to 4 are schematic cross-sectional views of structures obtained through respective steps S12, S14, and S16 of the flowchart illustrated in FIG. 1. A semiconductor layer 16 can be made of, for instance, silicon (Si).

The semiconductor layer 16 has a main surface 16a that is divided into a region 14 and a region 15. Just before AlSi is formed, a structure formed in the region 15 of the main surface 16a is thicker than a structure formed in the region 14 of the main surface 16a.

In other words, a structure that is formed in the semiconductor layer 16 before AlSi is formed, has a pattern 40 provided with asperities consisting of a dent in the region 14 and a protrusion in the region 15. In the following description, the pattern 40 and the semiconductor layer 16, together, are referred to as a substrate 10. The substrate 10 has the pattern 40 on a side where the material of the aluminum film undergoes sputtering.

To be specific, the main surface 16a of the semiconductor layer 16 is provided with, in part of the region 15, a conductive silicon film 18 and a silicon oxide film 17 covering the silicon film 18. The silicon oxide film 17 covers the upper surface (i.e., a surface opposite the main surface 16a) and side surfaces of the silicon film 18.

The silicon film 18 serves as, for instance, a first electrode of a vertical transistor (not shown) that is formed in the semiconductor layer 16, on a side near the main surface 16. The silicon oxide film 17 serves as, for instance, an interlayer insulating film.

The silicon film 18 is made of, for instance, polysilicon. The silicon oxide film 17 is made of, for instance, tetraethoxysilane (TEOS). The silicon film 18 and the silicon oxide film 17 are not formed in the region 14.

Provided is a nucleation layer 19 that covers the main surface 16a and the silicon oxide film 17. The nucleation layer 19 covers the main surface 16a in the region 14, and in the region 15 where the silicon oxide film 17 is not disposed. The nucleation layer 19 facilitates forming of the nucleus of the AlSi film when the AlSi film is formed, and is made of, for instance, titanium (Ti) or titanium nitride (TiN).

As seen from the above structure, the substrate 10 includes the semiconductor layer 16, the silicon film 18, the silicon oxide film 17, and the nucleation layer 19. The asperities of the pattern 40 are mainly formed of the silicon film 18 and the silicon oxide film 17.

Step S11 is forming the first film by sputtering the target (i.e., the material of the aluminum film) onto the substrate 10, more specifically, onto the nucleation layer 19. An AlSi film 111 (FIG. 2) is the first film that has been reflowed. Further, an AlSi film 112 (FIG. 3) is a combination of the first and second films that have been reflowed. Still further, an AlSi film 113 (FIG. 4) is a combination of the first, second and third films that have been reflowed. The AlSi film 113 serves as, for instance, a second electrode of the aforementioned vertical transistor.

A surface 113a exposed above the AlSi film 113 (i.e., the surface 113a is exposed in a direction opposite from the substrate 10) is dented at a depth 12 above the region 14 so as to reflect the asperities of the pattern 40 of the substrate 10.

Figure 5:
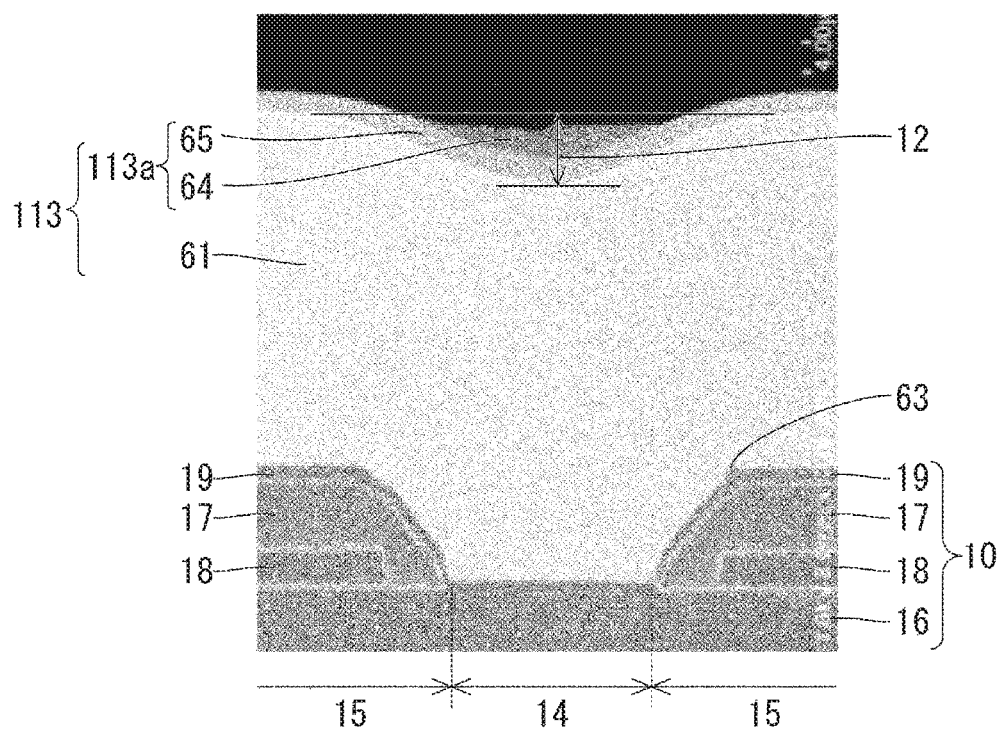
FIG. 5 is a cross-sectional image of a structure obtained through the method according to the preferred embodiment, the cross-sectional image being viewed with a microscope.

FIG. 5 is a cross-sectional image of the schematically illustrated structure in FIG. 4, the cross-sectional image being viewed with a microscope. In FIG. 5, the surface 113a in FIG. 4 is found together with a cross-section 61 of the AlSi film 113. FIG. 5 illustrates that the region 14 in FIG. 4 is sandwiched between the regions 15 also in the depth direction of the drawing sheet. The surface 113a is seen as being formed of side surfaces 65 of the dent, and of a front surface 64 extending in the depth direction from the dent. A deposition 63 mainly composed of Si is also seen in the cross-section 61.

The scale at the upper right of FIG. 5 is marked in 0.4 µm increments. The thickness of the AlSi film 113 (i.e., the thickness of the cross-section 61) is approximately 4.8 µm, which is reflected by the film formation in steps S11, S13, and S15. The depth 12 is approximately 0.9 µm.

FIG. 6 is a schematic cross-sectional view of a structure obtained after further film formation is performed to the structure of FIG. 4. To be specific, a nickel (Ni)-plated film 13 and a gold (Au)-plated film 11 are stacked on the AlSi film 113 in this order. The plated films 11 and 13 can be used for, for instance, connection of a leading wire extending from the second electrode. Providing the Au-plated film 11 is advantageous in preventing the oxidation of the Ni-plated film 13.

FIG. 7 is a cross-sectional image of a structure that includes an AlSi film 20 formed through a method for forming an aluminum film according to a first comparative example of the preferred embodiment, the cross-sectional image being viewed with a microscope. FIG. 7 shows that the AlSi film 20 is formed of a cross-section 21, a front surface 24, and side surfaces 25, which respectively correspond to the cross-section 61, front surface 64, and side surfaces 65 of the AlSi film 113 in FIG. 5. The scale at the upper right of FIG. 7 is marked in 0.4 μm increments.

The first comparative example is different from the preferred embodiment only in that the AlSi film 20 is formed by one sputtering and one heating. The other conditions are almost the same; the thickness of the resultant AlSi film 20 is almost equal to the thickness of the AlSi film 113, that is, 4.8 μm. In the first comparative example as well, a deposition 23 mainly composed of Si is found in the cross-section 21.

FIG. 7 shows a depth 22 of the dent, which corresponds to the depth 12 of the dent in FIG. 5. The depth 22 is approximately 3.3 μm. Accordingly, the preferred embodiment achieves an aluminum film having higher flatness than that achieved in the first comparative example, without using a long-throw sputtering method.

FIG. 8 is a flowchart illustrating a method for forming an aluminum film according to a second comparative example of the preferred embodiment. Step S21 is forming the first film in the same manner as step S11. The first film herein is 2.4 μm thick. Step S22 is reflowing the first film through heating. Step S23 is forming the second film in the same manner as step S13. The second film herein is 2.4 μm thick. Step S24 is reflowing at least the second film through heating. The reflowing of the first film may be performed through the heating in step S24. Both of the first and second films are made of AlSi.

Figure 9:
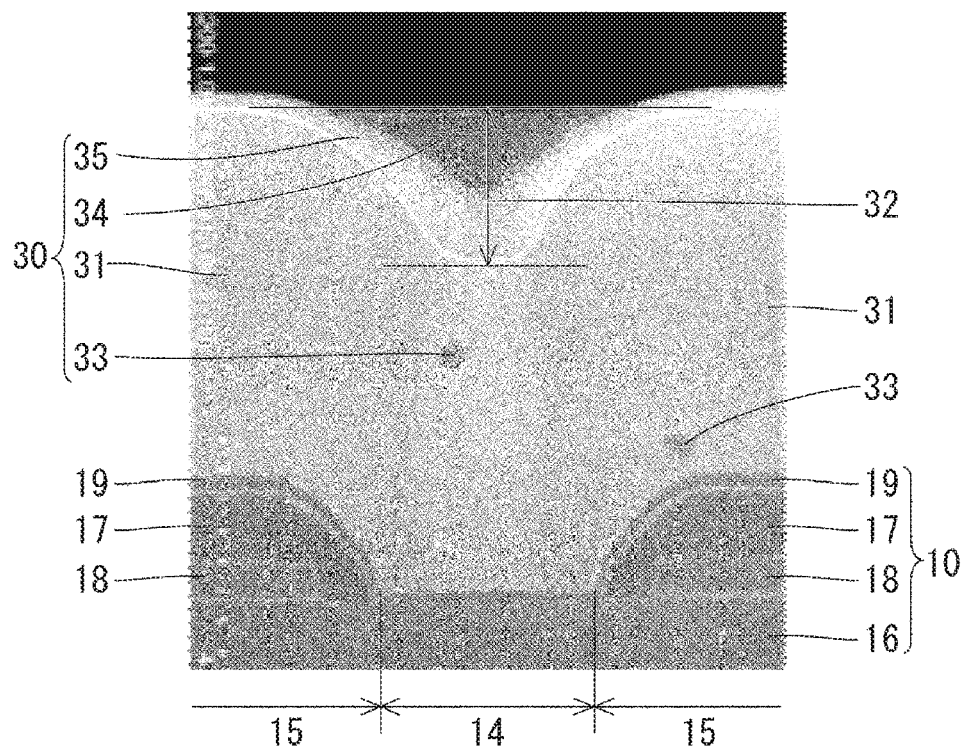
FIG. 9 is a cross-sectional image of a structure obtained through the method according to the second comparative example, the cross-sectional image being viewed with a microscope.

FIG. 9 is a cross-sectional image of a structure that includes an AlSi film 30 formed through the method according to the second comparative example, the cross-sectional image being viewed with a microscope. FIG. 9 shows that the AlSi film 30 is formed of a cross-section 31, a front surface 34, and side surfaces 35, which respectively correspond to the cross-section 61, front surface 64, and side surfaces 65 of the AlSi film 113 in FIG. 5. The scale at the lower left of FIG. 9 is marked in 0.4 μm increments.

The second comparative example is different from the preferred embodiment only in that the AlSi film is formed by double sputtering and double heating. The other conditions are almost the same; the thickness of the resultant AlSi film 30 is almost equal to the thickness of the AlSi film 113, that is, 4.8 μm. In the second comparative example as well, a deposition 33 mainly composed of Si is found in the cross-section 31.

FIG. 9 shows a depth 32 of the dent, which corresponds to the depth 12 of the dent in FIG. 5. The depth 32 is approximately 2.3 μm. Accordingly, the second comparative example achieves an aluminum film having higher flatness than that achieved in the first comparative example. The preferred embodiment achieves an aluminum film having higher flatness than that achieved in the second comparative example.

The foregoing has demonstrated that film formation through a plurality of times of reflow sputtering is advantageous in that an aluminum film is achieved that has higher flatness than an aluminum film of the same thickness. The foregoing has also demonstrated that more times of reflow sputtering are advantageous. An aluminum film having high flatness is advantageous in preventing cavities found in a Ni-plated film disposed on the aluminum film.

It is advantageous for the first film, obtained through the first reflow sputtering, to have a small thickness in heating at low temperature. Such a small thickness improves the flowability of the first film even under low heating temperature, and thus keeps reflowing (c.f., step S12 in FIG. 1) going on. This is advantageous in that the first film is formed so as to well cover the asperities of the pattern 40 (c.f., FIG. 2) of the substrate 10. Such improvement in covering capability lowers the possibility of overhanging even in the formation of the second and third films, thereby preventing the aforementioned cavities.

It is advantageous for the first film to have a small thickness in enhanced adhesion between the first film and a base under the first film (i.e., the nucleation layer 19 in the above example). Such adhesion enhancement prevents the cavities.

In view of the forgoing, the first film desirably has, to be specific, a thickness less than 1 μm. Meanwhile, the first film desirably has a thickness equal to or greater than 0.1 μm in order to uniformly form the first film through sputtering. Thus, the first film preferably has a thickness that is equal to or greater than 0.1 μm and less than 1 μm. In step S11 in FIG. 1, for instance, an AlSi film is formed to have a thickness of 0.2 μm.

The method for forming the aluminum film according to the preferred embodiment is particularly effective when the thickness of a resultant aluminum film (i.e., the AlSi film in the above example) is equal to or greater than 3.0 μm. This is because an aluminum film with such a thickness that is formed through the method in the first or second comparative example, is conspicuously dented. Hence, the method according to the preferred embodiment is suitable in forming an aluminum film of the order of microns.

In the structures of FIGS. 5, 7, and 9, the step formed by the asperities of the substrate 10, to be specific, the step formed by the asperities of the nucleation layer 19 in conformity with the shape of the silicon oxide film 17, is inclined at merely about 45 degrees with respect to the semiconductor layer 16 in cross-sectional view at the boundary between the regions 14 and 15. Such an angle of inclination creates no cavities found not only in the aluminum film in the preferred embodiment, but also in the aluminum films in the first and second comparative examples.

Figure 10:
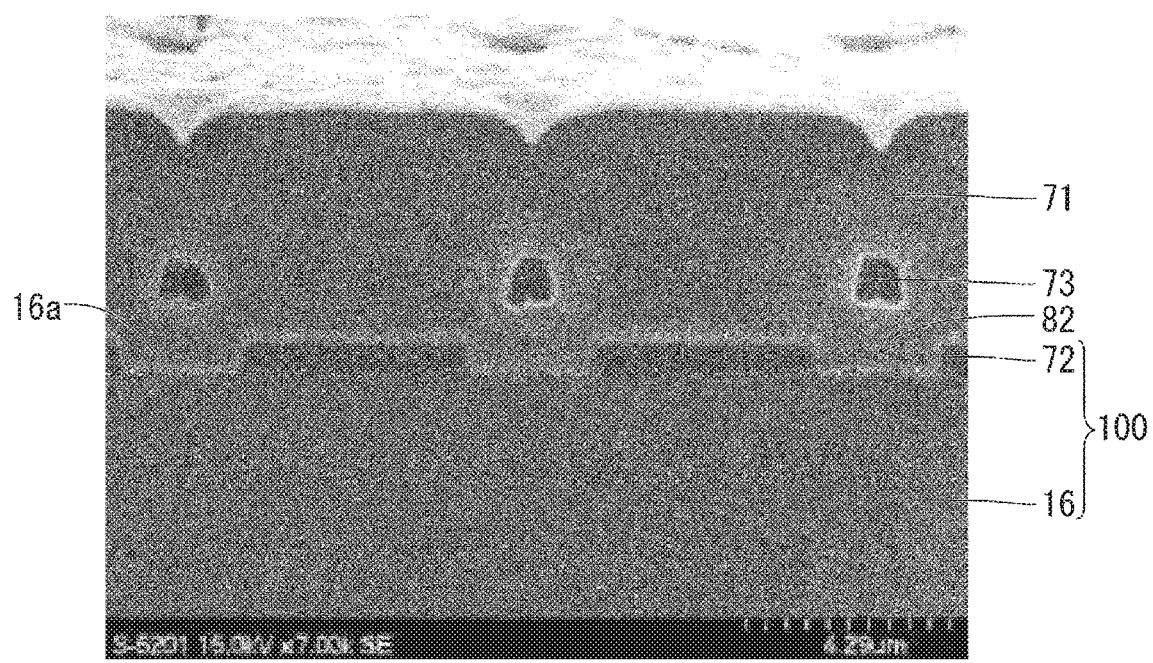
FIG. 10 is a cross-sectional image of a structure obtained through the method according to the first comparative example, the cross-sectional image being viewed with a microscope.
Figure 11:
FIG. 11 is a cross-sectional image of the structure obtained through the method according to the preferred embodiment, the cross-sectional image being viewed with a microscope.

FIG. 10 is a cross-sectional image of an aluminum film formed on a substrate 100 through the method according to the first comparative example. FIG. 11 is a cross-sectional image of an aluminum film formed on the substrate 100 through the method according to the preferred embodiment. Both of the cross-sectional images are viewed with a microscope. The scales at the lower right of both drawings are marked in 0.429 μm increments.

The substrate 100 has the semiconductor layer 16, and projections 72 disposed on the main surface 16a of the semiconductor layer 16. Each projection 72, together with the semiconductor layer 16, forms a recess 82. As such, the substrate 100, like the substrate 10, has a pattern of asperities. The projection 72 is located in a position corresponding to the region 15 in FIGS. 2 to 7 and FIG. 9. The bottom of each recess 82 is located in a position corresponding to the region 14. The projections 72 are each a rectangle in plan view. The asperities thus have an angle of inclination of approximately 90 degrees in plan view.

FIG. 10 shows an AlSi film 71 that is obtained by film formation through one sputtering and by reflowing through one heating. FIG. 11 shows an AlSi film 81 that is obtained according to the flowchart as illustrated in FIG. 1. The other conditions for film formation are common between the AlSi films 71 and 81; both films have a thickness of approximately 4.8 μm.

The AlSi film 71 has cavities 73 above the recesses 82 (i.e., the cavities 73 are found opposite the semiconductor layer 16). In addition, the AlSi film 71 has a conspicuously dented surface. The AlSi film 81, by contrast, has no cavities and has a shallowly dented surface. Accordingly, the need for a process of reducing cavities through heating at a temperature close to the melting point of aluminum is reduced by the method according to the preferred embodiment.

A smaller depth of the recess 82 further improves the flatness of an aluminum film on the substrate 100, and further improves cavity prevention. In view of such improvements, the recess 82 advantageously has an aspect ratio equal to or smaller than 0.5 in cross-sectional view. The aspect ratio, to be specific, is the ratio of the depth of the recess 82 to the length of the bottom of the recess 82 in cross-sectional view. In other words, each projection 72 advantageously has a height equal to or smaller than half the interval between the adjacent projections 72 in the asperity pattern of the substrate 100, in improving the flatness of the aluminum film and cavity prevention.

In this way, flatness achievement in the aluminum film and cavity prevention are advantageous in relation to the shape of the silicon oxide film 17 and a process step for forming the silicon oxide film 17, even when the asperity pattern of the substrate 100 has an angle of inclination of approximately 90 degrees.

To be specific, the silicon oxide film 17 less needs to be formed to be gently inclined as illustrated in FIG. 5 (alternatively, as illustrated in FIG. 7 or FIG. 9). A gentle inclination renders the silicon oxide film 17 thin between the silicon film 18 and the AlSi film 113 (alternatively, between the silicon film 18 and the AlSi film 20 or 30). Further, forming such a gentle inclination requires an additional process step of shaving the silicon oxide film 17. Hence, the silicon oxide film 17 advantageously has a steep inclination in insulating the silicon film 18 from the AlSi film 113.

The semiconductor layer 16 may be made of, for instance, silicon carbide (SiC). For instance, a MOS field-effect transistor, which is a semiconductor device, may be formed in the semiconductor layer 16. SiC wafers are smaller than Si wafers in most cases. A SiC wafer is about 6 inches in diameter, whereas a Si wafer that is available in the state of the art, for instance, is about 8 inches in diameter.

Accordingly, an apparatus is used that can handle a wafer having a small diameter, in semiconductor device manufacture using a SiC wafer. However, such an apparatus is a previous-generation manufacturing apparatus, and few manufacturers of such manufacturing apparatuses have the latest facilities that can handle wafers having a small diameter. As such, the shape of the asperities of the pattern 40, which is included in the main surface 16a of the semiconductor layer 16, by extension, in the substrate 10, seems to vary (fluctuate).

In the event of such fluctuations, the method according to the preferred embodiment enables an aluminum film that has high flatness and few cavities, to be formed through sputtering. Consequently, instead of the latest facilities that can handle Si wafers, the previous-generation manufacturing apparatuses can be employed to manufacture semiconductor devices using SiC wafers. This is advantageous in that no new apparatuses need to be set up when the semiconductor devices are manufactured using the SiC wafers.

The preferred embodiment has described that the quality of material of each component, the material of each component, conditions for implementations, and other things. They are illustrative, and are thus not limited to what are described herein.

For instance, the fourth and subsequent reflow sputtering may be performed after steps S15 and S16. Alternatively, an aluminum film flattened through the first to third reflow sputtering may undergo sputtering without reflowing, to thus increase the thickness of the aluminum film.

While the invention has been shown and described in detail, the foregoing description is in all aspects illustrative and not restrictive. It is therefore understood that numerous modifications and variations can be devised without departing from the scope of the invention.

What is claimed is:

1. A method for forming, on a substrate, an aluminum film made of a material that is aluminum or an aluminum compound, the method comprising performing, in this order, the steps of:
   forming a first film having a thickness that is equal to or greater than 0.1 μm and less than 1 μm, by sputtering the material onto the substrate;
   reflowing the first film by heating the first film;
   forming a second film by sputtering the material onto the first film that has been reflowed;
   reflowing the second film by heating the second film;
   forming a third film by sputtering the material onto the second film that has been reflowed; and
   reflowing the third film by heating the third film, wherein a resulting depth of a dent in an upper surface of the aluminum film is approximately 0.9 μm.

2. The method according to claim 1, wherein the aluminum film is formed to have a thickness equal to or greater than 3.0 μm.

3. The method according to claim 1, wherein the substrate comprises a pattern provided with asperities on a side where the material undergoes sputtering.

4. The method according to claim 2, wherein the substrate comprises a pattern provided with asperities on a side where the material undergoes sputtering.

* * * * *